(12) United States Patent
Takada

(10) Patent No.: US 7,848,399 B2
(45) Date of Patent: Dec. 7, 2010

(54) SEMICONDUCTOR INTEGRATED CIRCUIT

(75) Inventor: Shuichi Takada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 648 days.

(21) Appl. No.: 11/872,283

(22) Filed: Oct. 15, 2007

(65) Prior Publication Data

US 2008/0095224 A1 Apr. 24, 2008

(30) Foreign Application Priority Data

Oct. 20, 2006 (JP) ............................... 2006-286426

(51) Int. Cl.
*H04B 17/00* (2006.01)
*H04L 25/00* (2006.01)
(52) U.S. Cl. ...................... 375/226; 375/371
(58) Field of Classification Search .................. 375/226, 375/371
See application file for complete search history.

(56) References Cited

U.S. PATENT DOCUMENTS

| | | | | |
|---|---|---|---|---|
| 7,002,334 B2* | 2/2006 | Tanaka et al. | ............. | 324/76.11 |
| 7,463,680 B2* | 12/2008 | Buckwalter et al. | ......... | 375/233 |
| 2001/0005156 A1* | 6/2001 | Dosho | ......................... | 327/235 |
| 2002/0097075 A1* | 7/2002 | Ono et al. | ..................... | 327/175 |
| 2005/0127894 A1 | 6/2005 | Wyatt | | |
| 2005/0163204 A1 | 7/2005 | Brewer | | |
| 2006/0126714 A1* | 6/2006 | Lin et al. | ..................... | 375/226 |

FOREIGN PATENT DOCUMENTS

JP 10-267999 10/1998

\* cited by examiner

*Primary Examiner*—Kevin Y Kim
(74) *Attorney, Agent, or Firm*—Turocy & Watson, LLP

(57) ABSTRACT

A semiconductor integrated circuit has first and second delay circuits that have n (n is an integer equal to or larger than 2) delay elements connected in series, respectively, and in which an identical input signal is inputted to delay elements at a first stage and output signals of delay elements at a kth (k is an integer satisfying a condition $1 \leq k \leq n-1$) stage are inputted to delay elements at a k+1th stage and a detection circuit that has n edge detecting units and a readout unit and in which a jth (j is an integer satisfying a condition $1 \leq j \leq n$) edge detecting unit is inputted with an output signal of a delay element at a jth stage of the first delay circuit and an output signal of a delay element at an n−j+1th stage of the second delay circuit, detects whether periods of rising or falling changes of the two signals overlap, and counts a number of times of the detection, and the readout unit reads out the counted number of times of the detection.

20 Claims, 6 Drawing Sheets

SEMICONDUCTOR INTEGRATED CIRCUIT

CROSS REFERENCE TO RELATED APPLICATIONS

This application is based upon and claims the benefit of priority from the Japanese Patent Application No. 2006-286426, filed on Oct. 20, 2006, the entire contents of which are incorporated herein by reference.

BACKGROUND OF THE INVENTION

1. Field of the Invention

The present invention relates to a semiconductor integrated circuit.

2. Related Art

An internal clock signal of an LSI generally includes jitter, which is temporal fluctuation in a clock signal. Since the jitter causes malfunction of the LSI, a value of the jitter needs to be kept within tolerance.

There are the following methods as examples of a method of measuring jitter of an internal clock signal. One method is a method of outputting a clock signal from a pin of an LSI and measuring jitter in an external measurement apparatus. However, in this method, since an I/O terminal through which a high-speed clock signal in a GHz band can be inputted and outputted is necessary and the external measurement apparatus is also necessary, cost increases.

Another method is a method of generating a reference clock signal and a test data signal, a phase of which is shifted in synchronization with the reference clock signal, in an external IC tester, sampling the test data signal with an internal clock of an integrated circuit, and subjecting a sample signal to statistical processing with the external IC tester and measuring jitter of the internal clock of the integrated circuit (For example, see Japanese Patent Laid-Open No. 10-267999).

However, in this method, the external IC tester is necessary and the test data signal needs to be highly accurately subjected to phase adjustment.

Still another method is a method of qualitatively detect, when a clock generator is a phase lock loop (PLL), swing of a clock from output frequency of a phase error signal outputted from a phase comparator and swing of an LPF voltage. However, in this method, a jitter amount cannot be quantitatively measured and it is difficult to detect jitter failure.

As described above, the jitter measuring methods in the past have a problem in that clock jitter cannot be quantitatively measured in an LSI circuit.

SUMMARY OF THE INVENTION

According to one aspect of the present invention, there is provided a semiconductor integrated circuit comprising:

first and second delay circuits that have n (n is an integer equal to or larger than 2) delay elements connected in series, respectively, and in which an identical input signal is inputted to delay elements at a first stage and output signals of delay elements at a kth (k is an integer satisfying a condition $1 \leq k \leq n-1$) stage are inputted to delay elements at a k+1th stage; and a detection circuit that has n edge detecting units and a readout unit and in which a jth (j is an integer satisfying a condition $1 \leq j \leq n$) edge detecting unit is inputted with an output signal of a delay element at a jth stage of the first delay circuit and an output signal of a delay element at an n−j+1th stage of the second delay circuit, detects whether periods of rising or falling changes of the two signals overlap, and counts a number of times of the detection, and the readout unit reads out the counted number of times of the detection.

According to one aspect of the present invention, there is provided a semiconductor integrated circuit comprising:

first and second delay circuits that have n (n is an integer equal to or larger than 2) delay elements connected in series, respectively, and in which an identical input signal is inputted to delay elements at a first sage and output signals of delay elements at a kth (k is an integer satisfying a condition $1 \leq k \leq n-1$) stage are inputted to delay elements at a k+1th stage; and a detection circuit that has n edge detecting units and a readout unit and in which a jth (j is an integer satisfying a condition $1 \leq j \leq n$) edge detecting unit includes a first edge extracting unit that extracts a rising or falling change of an output signal of a delay element at a jth stage of the first delay circuit, a second edge extracting unit that extracts a rising or falling change of an output signal of a delay element at an n−j+1th stage of the second delay circuit, an intersection detecting unit that detects whether a period of the rising or falling change extracted by the first edge extracting unit and a period of the rising or falling change extracted by the second edge extracting unit overlap, and a counter that counts a number of times of the detection, and the readout unit reads out the counted number of times of the detection.

According to one aspect of the present invention, there is provided a semiconductor integrated circuit comprising:

first and second delay circuits that have n (n is an integer equal to or larger than 2) delay elements connected in series, respectively, and in which an identical input signal is inputted to delay elements at a first sage and output signals of delay elements at a kth (k is an integer satisfying a condition $1 \leq k \leq n-1$) stage are inputted to delay elements at a k+1th stage;

a detection circuit that has n edge detecting units and a readout unit and in which a jth (j is an integer satisfying a condition $1 \leq j \leq n$) edge detecting unit is inputted with an output signal of a delay element at a jth stage of the first delay circuit and an output signal of a delay element at an n−j+1th stage of the second delay circuit, detects whether periods of rising or falling changes of the two signals overlap, and counts a number of times of the detection, and the readout unit reads out the counted number of times of the detection; and an arithmetic unit that is connected to the readout unit, performs statistical processing on the basis of the number of times of the detection counted in each of the n edge detecting units, and calculates a statistic amount of jitter included in the input signal.

DETAILED DESCRIPTION OF THE INVENTION

A semiconductor integrated circuit according to an embodiment of the present invention will be hereinafter explained with reference to the accompanying drawings.

Figure 1:
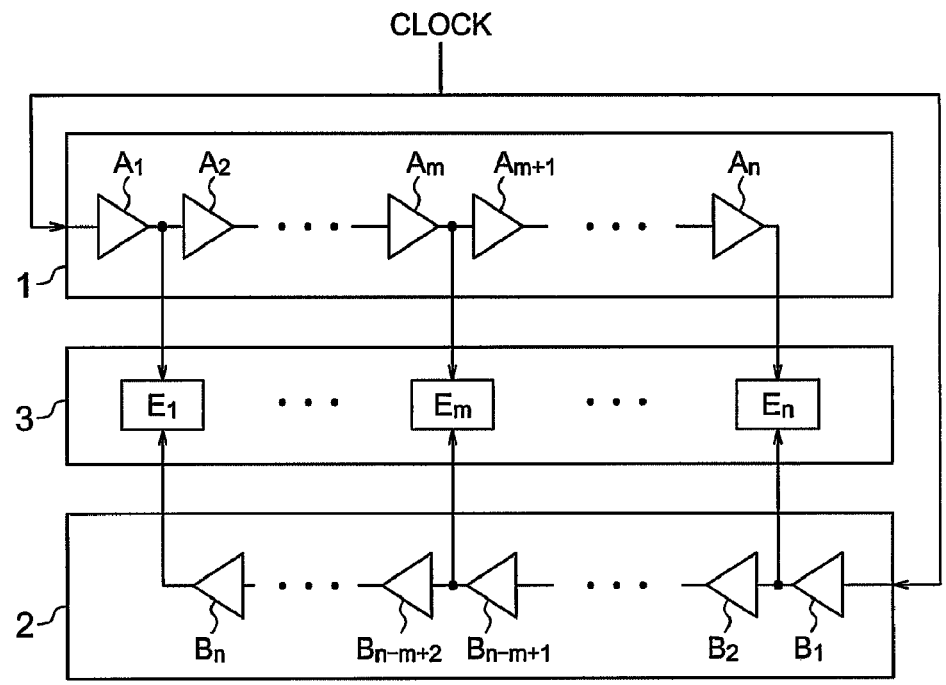
FIG. 1 is a diagram showing a schematic structure of a jitter measuring device according to an embodiment of the present invention.

The semiconductor integrated circuit incorporates a jitter measuring device including a delay circuit 1, a delay circuit 2, and a detection circuit 3 shown in FIG. 1.

The delay circuit 1 has n (n is an integer equal to or larger than 2) delay elements $A_1$ to $A_n$ connected in series. Similarly, the delay circuit 2 has n (n is an integer equal to or larger than 2) delay elements $B_1$ to $B_n$ connected in series. It is assumed that all delay amounts of the delay elements $A_1$ to $A_n$ and $B_1$ to $B_n$ are equal.

A clock signal CLOCK is inputted to the delay elements $A_1$ and $B_1$. This clock signal is an internal clock signal of the semiconductor integrated circuit. The clock signal delayed by a delay element $A_m$ (m is an integer satisfying a condition $1 \leq m \leq n-1$) is outputted to a delay element $A_{m+1}$. The clock signal delayed by a delay element $B_m$ (m is an integer satisfying a condition $1 \leq m \leq n-1$) is outputted to a delay element $B_{m+1}$.

The detection circuit 3 includes n (n is an integer equal to or larger than 2) edge detecting units $E_1$ to $E_n$. Outputs of delay elements $A_j$ and $B_{n-j+1}$ are inputted to an edge detecting unit $E_j$ (j is an integer satisfying a condition $1 \leq j \leq n$). The edge detecting unit $E_j$ can detect whether rising edges of signals outputted from the delay elements $A_j$ and $B_{n-j+1}$ intersect.

Figure 2:
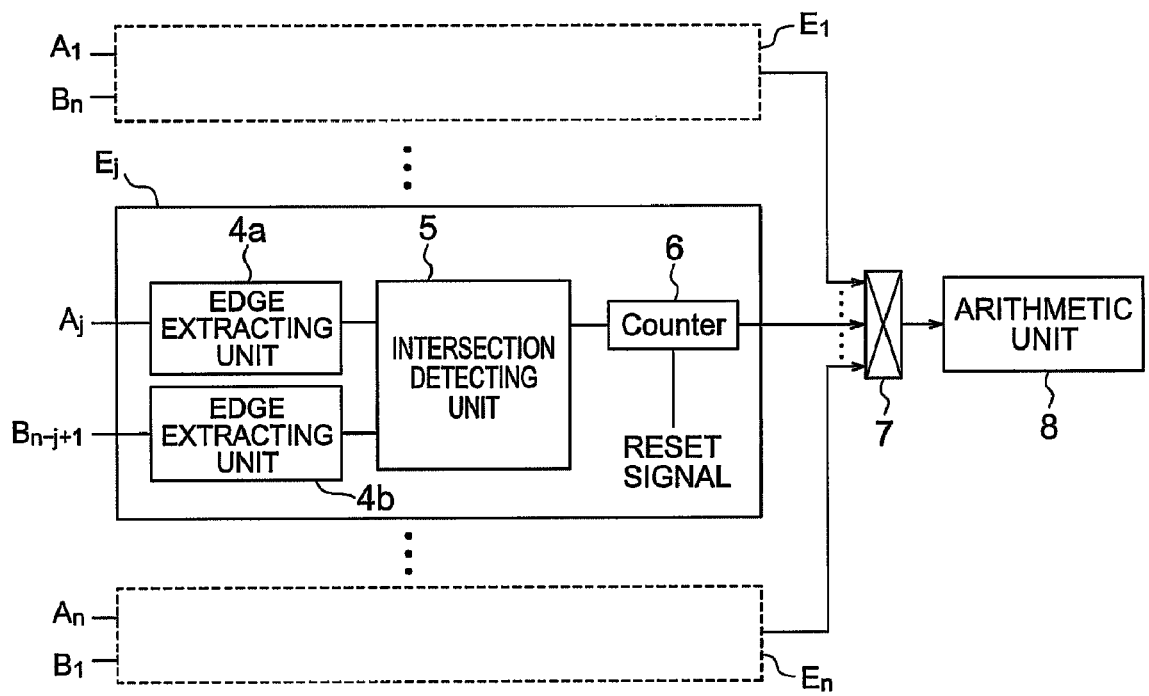
FIG. 2 is a diagram showing a schematic structure of a detection circuit in the jitter measuring device according to the embodiment.

A schematic structure of a detection circuit is shown in FIG. 2. The detection circuit includes edge detecting units $E_1$ to $E_n$ and a readout unit 7. The edge detecting unit $E_j$ has edge extracting units 4a and 4b, an intersection detecting unit 5, and a counter 6.

An input terminal of the edge extracting unit 4a is connected to an output terminal of the delay element $A_j$ (not shown) and extracts and outputs a rising edge of a signal outputted from the delay element $A_j$. Similarly, an input terminal of the edge extracting unit 4b is connected to an output terminal of the delay element $B_{n-j+1}$ and extracts and outputs a rising edge of a signal outputted from the delay element $B_{n-j+1}$. The intersection detecting unit 5 detects whether the edges extracted by the edge extracting units 4a and 4b intersect. The counter 6 counts the number of times of detection. A reset signal for resetting a count value is given to the counter 6.

Figure 3:
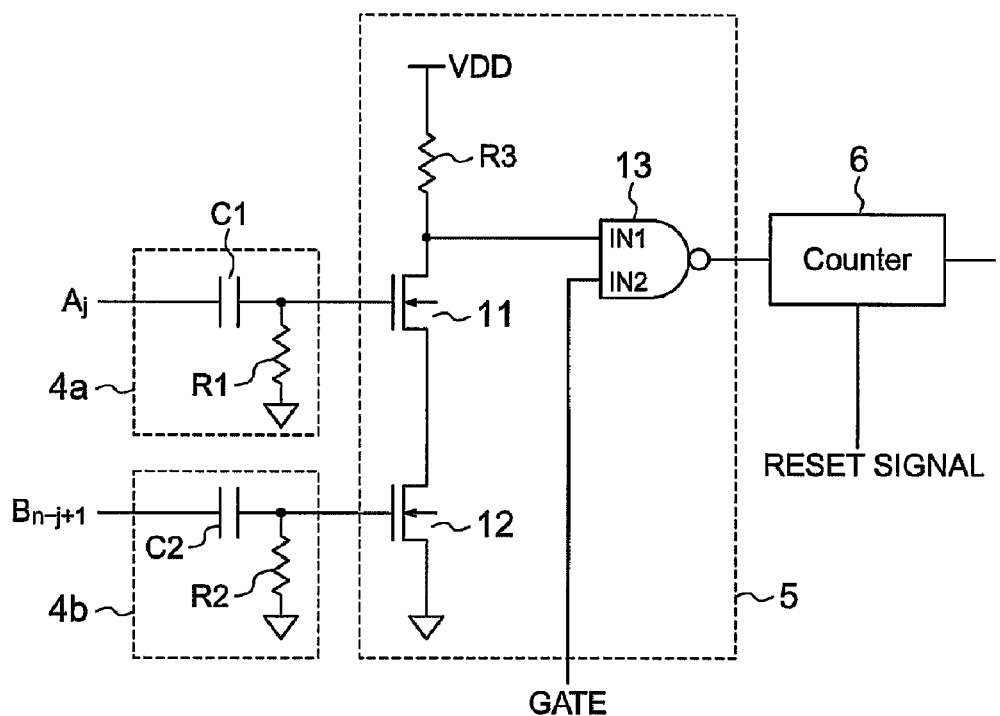
FIG. 3 is a diagram showing a schematic structure of a detection circuit in the jitter measuring device according to the embodiment.

An example of the structure of the edge extracting units 4a and 4b and the intersection detecting unit 5 is shown in FIG. 3. The edge extracting unit 4a has a capacitor C1 and a resistor R1. One terminal of the capacitor C1 is connected to the output terminal of the delay element $A_j$ (not shown) and the other terminal thereof is connected to the grounded resistor R1.

Similarly, the edge extracting unit 4b has a capacitor C2 and a resistor R2. One terminal of the capacitor C2 is connected to the output terminal of the delay element $B_{n-j+1}$ (not shown) and the other terminal thereof is connected to the grounded resistor R2.

The intersection detecting unit 5 has transistors 11 and 12, a NAND gate 13, and a resistor R3. One terminals of source and drain electrodes of the transistors 11 and 12 are connected to each other. The other terminal of the source and drain electrodes of the transistor 12 is grounded. One terminal of the resistor R3 is connected to a power supply voltage line VDD and the other terminal thereof is connected to the other terminal of the source and drain electrodes of the transistor 11. A gate electrode of the transistor 11 is connected to the other terminal of the capacitor C1. A gate electrode of the transistor 12 is connected to the other terminal of the capacitor C2.

The NAND gate 13 has two input terminals IN1 and IN2. The input terminal IN1 is connected to the resistor R3 and the source and drain electrodes of the transistor 11. A gate signal GATE is inputted to the input terminal IN2. The gate signal GATE takes a first predetermined value (high level). An output of the NAND gate 13 is inputted to the counter 6.

The counter 6 of the edge detecting unit $E_j$ is connected to the readout unit 7. Count values of counters in the respective edge detecting units are read out. The readout unit 7 is, for example, a selector circuit and selects and outputs a count value of the counters included in the n edge detecting units $E_1$ to $E_n$. The outputted count value is inputted to an arithmetic unit 8. The arithmetic unit 8 performs statistical processing on the basis of the count value and calculates a statistic amount of jitter included in a clock signal. The arithmetic unit 8 may be provided in the same semiconductor integrated circuit or may be provided as an external circuit. The statistical processing is described later.

Figure 4:
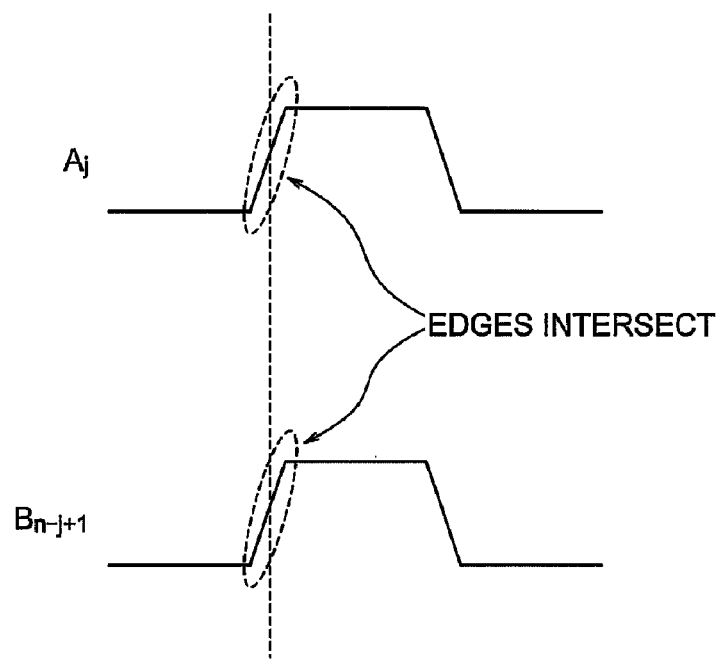
FIG. 4 is a diagram showing an example of a clock signal inputted to an edge detecting unit.

For example, as shown in FIG. 4, when rising edges of delayed clock signals outputted from the delay elements $A_j$ and $B_{n-j+1}$ intersect, high-level signals are outputted from the edge extracting units 4a and 4b, both the transistors 11 and 12 are turned on, and an input signal to the input terminal IN1 is at a low level. Since the gate signal GATE is at a high level, an output of the NAND gate 13 is at a high level and a count value of the counter 6 increases by 1. Consequently, it is possible to count the number of times of intersection of the rising edges. When at least one of the transistors 11 and 12 is off, since an input signal to the input terminal IN1 is at a high level, an output of the NAND gate 13 is at a low level.

Figure 5:
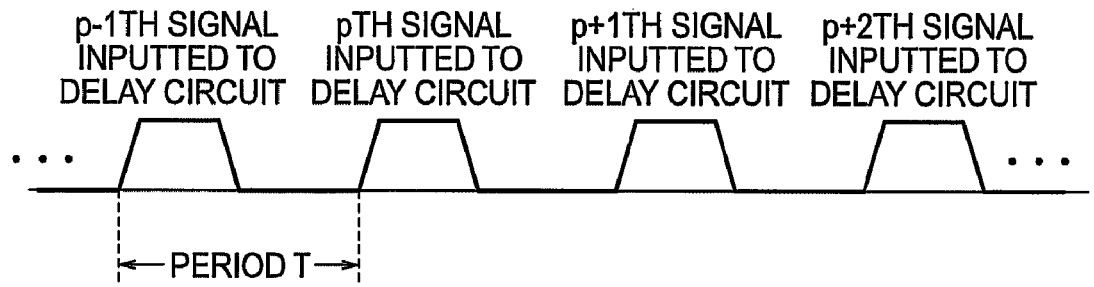
FIG. 5 is a diagram showing an example of a clock signal inputted to a delay circuit.

A method of measuring jitter using the jitter measuring device is explained. It is assumed that a total delay time of the delay circuits 1 and 2 (a delay amount "d" per one delay element×the number of delay elements "n") is two or more times as large as a period T of an inputted clock signal and the number of delay elements "n" is n=2k+1 (k is an integer equal to or larger than 1). It is assumed that clock signals shown in FIG. 5 are inputted to the delay circuits 1 and 2, respectively.

Both an output of a delay element $A_{k+1}$ located in the center among 2k+1 delay elements of the delay circuit 1 and an output of a delay element $B_{k+1}$ located in the center among 2k+1 delay elements of the delay circuit 2 are inputted to the edge detecting unit $E_{k+1}$.

When there is no jitter in clock signals inputted to the delay circuits 1 and 2, signals inputted to the edge detecting unit $E_{k+1}$ are delayed by an equal time. The edge detecting unit $E_{k+1}$ detects intersection of edges of pth (p is an integer equal to or larger than 1) clock signals inputted to the delay circuits 1 and 2, respectively. A count value increases every time edges intersect.

When it is assumed that the period T is even number times as large as the delay amount "d" for simplification of explanation, an output of a delay element $A_{k+1+T/2d}$ and an output of a delay element $B_{k+1-T/2d}$ are inputted to an edge detecting unit $E_{k+1+T/2d}$. The edge detecting unit $E_{k+1+T/2d}$ detects intersection of an edge of a pth clock signal inputted to the delay circuit 1 and an edge of a p+1th clock signal inputted to the delay circuit 2.

Similarly, an output of a delay element $A_{k+1-T/2d}$ and an output of a delay element $B_{k+1+T/2d}$ are inputted to an edge detecting unit $E_{k+1-T/2d}$. The edge detecting unit $E_{k+1-T/2d}$ detects intersection of an edge of a p+1th clock signal inputted to the delay circuit 1 and an edge of a pth clock signal inputted to the delay circuit 2.

Figure 6:
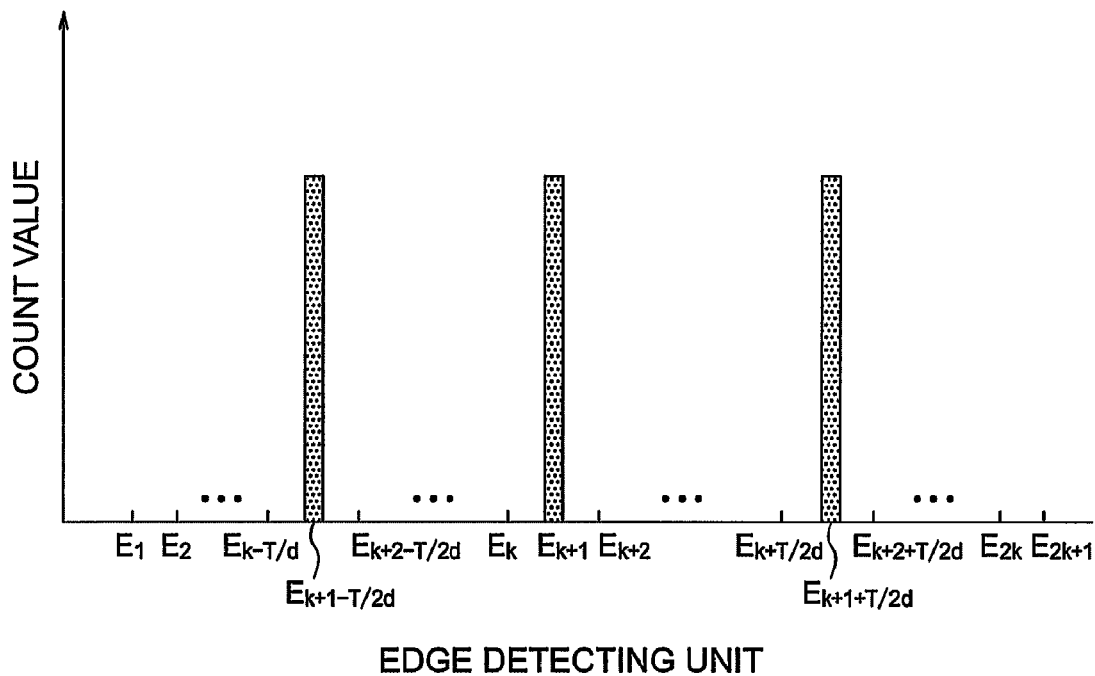
FIG. 6 is a diagram showing an example of a distribution of count values in respective edge detecting units.

When there is no jitter in clock signals inputted to the delay circuits 1 and 2, count values in the respective edge detecting units are as shown in FIG. 6.

On the other hand, when jitter is superimposed on clock signals inputted to the delay circuits 1 and 2, intersection of edges of pth clock signals inputted to the delay circuits 1 and 2, respectively, is detected not only by the edge detecting unit $E_{k+1}$ but also by edge detecting units $E_k$ and $E_{k+2}$ before and behind the edge detecting unit $E_{k+1}$. When a jitter amount is large, the intersection is detected by edge detecting units $E_{k-1}$ and $E_{k+3}$ as well.

Similarly, intersection of an edge of a pth clock signal inputted to the delay circuit 1 and an edge of a p+1th clock signal inputted to the delay circuit 2 is detected by edge detecting units before and behind the edge detecting unit $E_{k+1+T/2d}$ as well. Intersection of an edge of a p+1th clock signal inputted to the delay circuit 1 and an edge of a pth clock signal inputted to the delay circuit 2 is detected by edge detecting units before and behind the edge detecting unit $E_{k+1-T/2d}$ as well.

Figure 7:
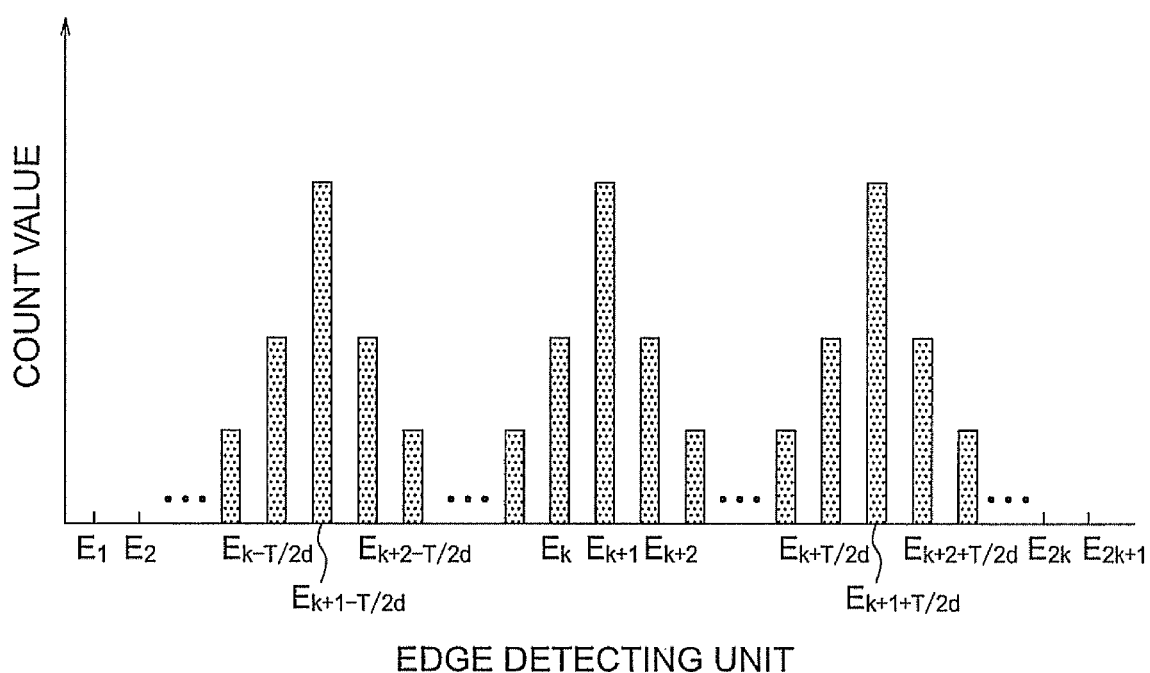
FIG. 7 is a diagram showing an example of a distribution of count values in the respective edge detecting units.

When the jitter is superimposed on the clock signals inputted to the delay circuits 1 and 2 in this way, count values in the respective edge detecting units are as shown in FIG. 7.

Figure 8:
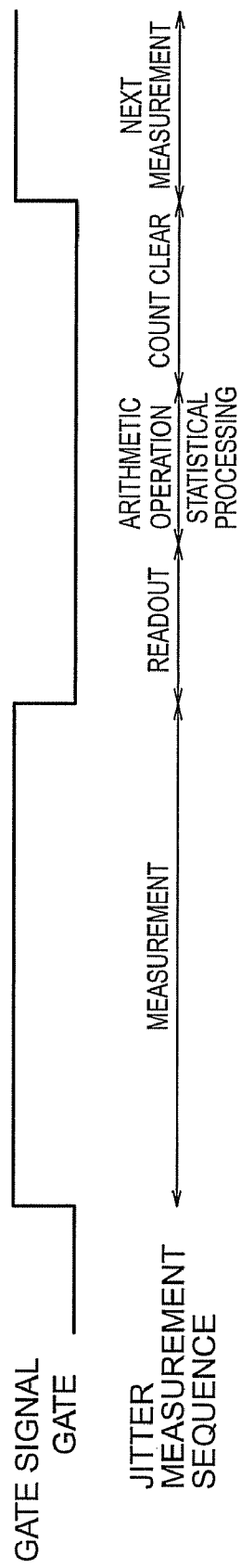
FIG. 8 is a diagram showing a measurement sequence in the jitter measuring device according to the embodiment.

A method of calculating jitter superimposed on a clock signal is explained. First, the gate signal GATE is set to a second predetermined value (low level) to prevent count values of the counters from increasing. Next, while inputs to the readout unit 7 are sequentially switched, count values of the counters 6 of the edge detecting units $E_1$ to $E_n$ are read out and outputted to the arithmetic unit 8. Consequently, a distribution of count values shown in FIG. 7 is obtained. The series of operations are as shown in FIG. 8.

Figure 9:
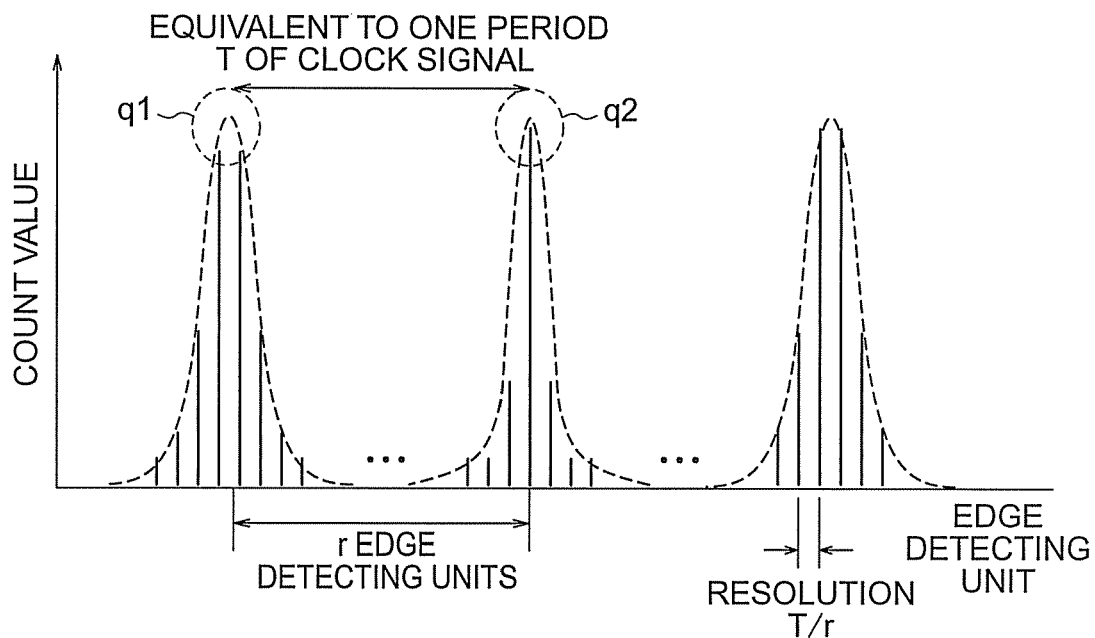
FIG. 9 is a diagram showing an example of a distribution of count values in the respective edge detecting units.

In FIG. 9, a section from the peak (q1) of a mountain to the peak (q2) of the next mountain of count values is equivalent to one period of a clock signal. When the number of edge detecting units from the peak (q1) to the peak (q2) is "r", since the period T of the clock signal is known in advance, resolution between edge detecting units adjacent to each other is T/r.

Figure 10:
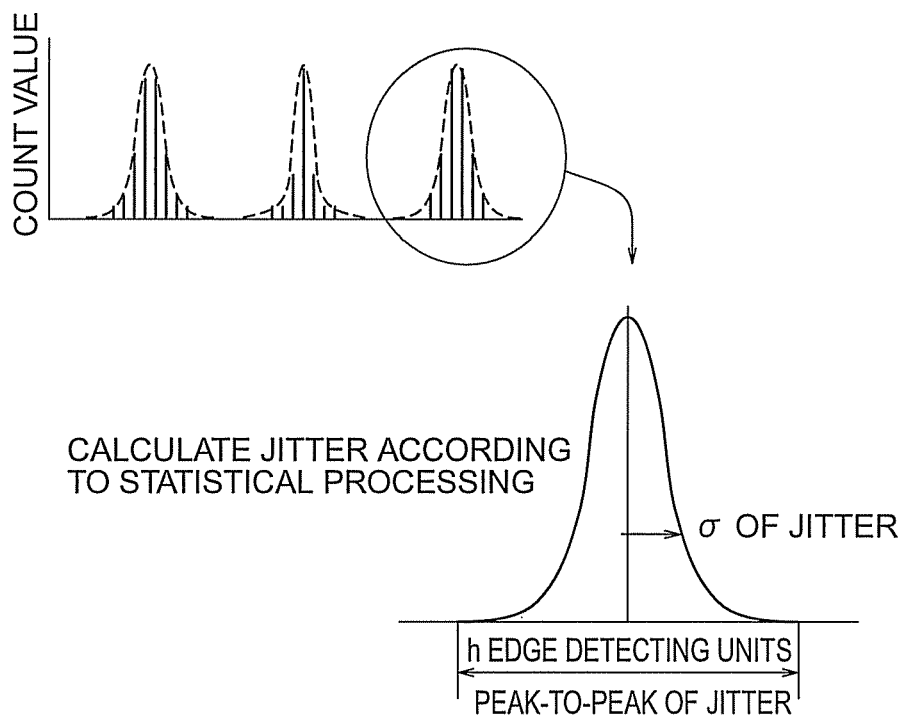
FIG. 10 is a diagram showing a method of quantitatively measuring jitter from a count value distribution.

As shown in FIG. 10, when the spread of the foot of a mountain is equivalent to h edge detecting units, peak-to-peak of jitter is h×T/r. When an envelope of the mountain is subjected to statistical processing and a standard deviation of a distribution is σ, a standard deviation of the jitter is σ×T/r. In this way, it is possible to quantitatively measure the jitter included in the clock signal. In order to perform such statistical processing, it is preferable that a total delay time of the delay circuits 1 and 2 is two or more times as large as an inputted clock signal such that a section from the peak of a mountain to the peak of the next mountain in a count value distribution and the spread of the foot of the mountains are within the total delay time.

As described above, it is possible to quantitatively measure clock jitter in the jitter measuring device incorporated in the semiconductor integrated circuit according to the embodiment of the present invention.

In the embodiment, intersection of rising edges of signals is detected. However, intersection of falling edges may be detected.

What is claimed is:

1. A semiconductor integrated circuit comprising:
    first and second delay circuits that have n (n is an integer equal to or larger than 2) delay elements connected in series, respectively, and in which an identical input signal is inputted to delay elements at a first stage and output signals of delay elements at a kth (k is an integer satisfying a condition 1≦k≦n−1) stage are inputted to delay elements at a k+1th stage; and
    a detection circuit that has n edge detecting units and a readout unit and in which a jth (j is an integer satisfying a condition 1≦j≦n) edge detecting unit is inputted with an output signal of a delay element at a jth stage of the first delay circuit and an output signal of a delay element at an n−j+1th stage of the second delay circuit, detects whether periods of rising or falling changes of the two signals overlap, and counts a number of times of the detection, and the readout unit reads out the counted number of times of the detection.

2. A semiconductor integrated circuit comprising:
    first and second delay circuits that have n (n is an integer equal to or larger than 2) delay elements connected in series, respectively, and in which an identical input signal is inputted to delay elements at a first sage and output signals of delay elements at a kth (k is an integer satisfying a condition 1≦k≦n−1) stage are inputted to delay elements at a k+1th stage; and
    a detection circuit that has n edge detecting units and a readout unit and in which a jth (j is an integer satisfying a condition 1≦j≦n) edge detecting unit includes a first edge extracting unit that extracts a rising or falling change of an output signal of a delay element at a jth stage of the first delay circuit, a second edge extracting unit that extracts a rising or falling change of an output signal of a delay element at an n−j+1th stage of the second delay circuit, an intersection detecting unit that detects whether a period of the rising or falling change extracted by the first edge extracting unit and a period of the rising or falling change extracted by the second edge extracting unit overlap, and a counter that counts a number of times of the detection, and the readout unit reads out the counted number of times of the detection.

3. The semiconductor integrated circuit according to claim 2, wherein
    the first edge extracting unit includes:
        a first capacitor, to one terminal of which the output signal of the delay element at the jth stage of the first delay circuit is inputted; and
        a first resistor, one terminal of which is grounded and the other terminal of which is connected to the other terminal of the first capacitor, and
    the second edge extracting unit includes:
        a second capacitor, to one terminal of which the output signal of the delay element at the n−j+1th stage of the second delay circuit is inputted; and
        a second resistor, one terminal of which is grounded and the other terminal of which is connected to the other terminal of the second capacitor.

4. The semiconductor integrated circuit according to claim 3, wherein
    the intersection detecting unit includes:
        a first transistor, one of source and drain electrodes of which is grounded and a gate electrode of which is connected to the other terminal of the second capacitor and the other terminal of the second resistor;
        a second transistor, one of source and drain electrodes of which is connected to the other of the source and drain electrodes of the first transistor and a gate electrode of which is connected to the other terminal of the first capacitor and the other terminal of the first resistor;
        a third resistor, one terminal of which is connected to a reference voltage line and the other terminal of which is connected to the other of the source and drain electrodes of the second transistor; and
        a logical circuit, to one input terminal of which a gate signal of a predetermined level is inputted, the other input terminal of which is connected to the other terminal of the third resistor and the other of the source and drain electrodes of the second transistor, and an output of which is inputted to the counter.

5. The semiconductor integrated circuit according to claim 4, wherein the logical circuit is a NAND gate circuit.

6. The semiconductor integrated circuit according to claim 5, wherein, when the readout unit reads out the number of times of the detection from the counter, the gate signal is at a low level.

7. The semiconductor integrated circuit according to claim 1, the readout unit is a selector circuit, selects each of the n edge detecting units, and outputs the counted number of times of the detection.

8. The semiconductor integrated circuit according to claim 2, wherein the counter is given with a reset signal and, when the number of times of the detection is read out by the readout unit, reset on the basis of the reset signal.

9. The semiconductor integrated circuit according to claim 1, wherein
all delay times of the n delay elements of the first delay circuit and the second delay circuit are the same, and
a total delay time of each of the first delay circuit and the second delay circuit is larger than time of two periods of the input signal.

10. The semiconductor integrated circuit according to claim 1, wherein the input signal is an internal clock signal.

11. A semiconductor integrated circuit comprising:
first and second delay circuits that have n (n is an integer equal to or larger than 2) delay elements connected in series, respectively, and in which an identical input signal is inputted to delay elements at a first sage and output signals of delay elements at a kth (k is an integer satisfying a condition $1 \leq k \leq n-1$) stage are inputted to delay elements at a k+1th stage;
a detection circuit that has n edge detecting units and a readout unit and in which a jth (j is an integer satisfying a condition $1 \leq j \leq n$) edge detecting unit is inputted with an output signal of a delay element at a jth stage of the first delay circuit and an output signal of a delay element at an n−j+1th stage of the second delay circuit, detects whether periods of rising or falling changes of the two signals overlap, and counts a number of times of the detection, and the readout unit reads out the counted number of times of the detection; and
an arithmetic unit that is connected to the readout unit, performs statistical processing on the basis of the number of times of the detection counted in each of the n edge detecting units, and calculates a statistic amount of jitter included in the input signal.

12. The semiconductor circuit according to claim 11, wherein
the jth edge detecting unit includes:
a first edge extracting unit that extracts a rising or falling change of the output signal of the delay element at the jth stage of the first delay circuit;
a second edge extracting unit that extracts a rising or falling change of the output signal of the delay element at the n−j+1 stage of the second delay circuit;
an intersection detecting unit that detects whether a period of the rising or falling change extracted by the first edge extracting unit and a period of the rising or falling change extracted by the second edge extracting unit overlap; and
a counter that counts the number of times of the detection.

13. The semiconductor integrated circuit according to claim 12, wherein
the first edge extracting unit includes:
a first capacitor, to one terminal of which the output signal of the delay element at the jth stage of the first delay circuit is inputted; and
a first resistor, one terminal of which is grounded and the other terminal of which is connected to the other terminal of the first capacitor, and
the second extracting unit includes:
a second capacitor, to one terminal of which the output signal of the delay element at the n−j+1th stage of the second delay circuit is inputted; and
a second resistor, one terminal of which is grounded and the other terminal of which is connected to the other terminal of the second capacitor.

14. The semiconductor integrated circuit according to claim 13, wherein
the intersection detecting unit includes:
a first transistor, one of source and drain electrodes of which is grounded and a gate electrode of which is connected to the other terminal of the second capacitor and the other terminal of the second resistor;
a second transistor, one of source and drain electrodes of which is connected to the other of the source and drain electrodes of the first transistor and a gate electrode of which is connected to the other terminal of the first capacitor and the other terminal of the first resistor;
a third resistor, one terminal of which is connected to a reference voltage line and the other terminal of which is connected to the other of the source and drain electrodes of the second transistor; and
a logical circuit, to one input terminal of which a gate signal of a predetermined level is inputted, the other input terminal of which is connected to the other terminal of the third resistor and the other of the source and drain electrodes of the second transistor, and an output of which is inputted to the counter.

15. The semiconductor integrated circuit according to claim 14, wherein the logical circuit is a NAND gate circuit.

16. The semiconductor integrated circuit according to claim 15, wherein, when the readout unit reads out the number of times of the detection from the counter, the gate signal is at a low level.

17. The semiconductor integrated circuit according to claim 11, the readout unit is a selector circuit, selects each of the n edge detecting units, and outputs the counted number of times of the detection to the arithmetic unit.

18. The semiconductor integrated circuit according to claim 11, wherein the arithmetic unit plots, in order, the number of times of the detection counted by each of the n edge detecting unit and performs the statistical processing using an envelop pattern.

19. The semiconductor integrated circuit according to claim 12, wherein the counter is given with a reset signal and, when the number of times of the detection is read out by the readout unit, reset on the basis of the reset signal.

20. The semiconductor integrated circuit according to claim 19, wherein the counter is reset after a statistic amount of jitter included in the input signal is calculated by the arithmetic unit.

* * * * *